United States Patent [19]
Ramirez

[11] Patent Number: 5,627,536
[45] Date of Patent: May 6, 1997

[54] MULTIPLEXED DELTA-SIGMA MODULATOR

[75] Inventor: Sergio R. Ramirez, Austin, Tex.

[73] Assignee: Advanced Micro Devices, Inc., Sunnyvale, Calif.

[21] Appl. No.: 364,039

[22] Filed: Dec. 27, 1994

[51] Int. Cl.$^6$ .................................................. H03M 1/00
[52] U.S. Cl. .......................... 341/141; 341/143; 341/155
[58] Field of Search ....................................... 341/141, 143, 341/155

[56] References Cited

U.S. PATENT DOCUMENTS

| | | | |
|---|---|---|---|
| 4,514,760 | 4/1985 | Balaban et al. | 358/143 |
| 5,235,558 | 8/1993 | Woodsum et al. | 367/92 |
| 5,248,971 | 9/1993 | Mandl | 341/143 |
| 5,345,233 | 9/1994 | Nagata et al. | 341/76 |
| 5,345,236 | 9/1994 | Sramek, Jr. | 341/144 |

*Primary Examiner*—Jeffrey A. Gaffin
*Assistant Examiner*—Jason L. W. Kost
*Attorney, Agent, or Firm*—Foley & Lardner

[57] ABSTRACT

A multiplexed delta-sigma modulator for performing analog to digital conversion on a plurality of input analog signals. These input analog signals are input to a multiplexer, where the input analog signals are converted into a single, time-division multiplexed analog signal. The time-division multiplexed analog signal is then received by the delta-sigma modulator, which oversamples the input signal and outputs a time-division multiplexed digital signal. The time-division multiplexed digital signal is then sent to a decimator which outputs a time-division multiplexed digital signal at a rate corresponding to the Nyquist rate of the input analog signals.

The signal is sent from the decimator to a first down-sampler, and then to a demultiplexer, where the time-division multiplexed, decimated signal is sent to the appropriate output port of the demultiplexer at a sequential rate corresponding to the sequential rate utilized by the input multiplexer. At each output port of the demultiplexer there is a second down-sampler operating at a predetermined rate to recover each of the plurality of digital output signals corresponding to the plurality of input analog signals.

21 Claims, 7 Drawing Sheets

MULTIPLEXED DELTA-SIGMA MODULATOR

BACKGROUND OF THE INVENTION

1. Field of the Invention

This invention relates to a multiplexed delta-sigma modulator. Specifically, this invention relates to the addition of downsamplers to a multiplexed, delta-sigma modulator, analog-to-digital converter, wherein the downsamplers operate at specified sampling rates.

2. Description of the Related Art

The general structure of an oversampled, delta-sigma modulator analog-to-digital converter (A/D) is shown in FIG. 1. In FIG. 1, an analog input signal 10-1 is applied to a delta-sigma modulator 20-1, where the analog input signal 10-1 is sampled at a frequency $f_s$. Note that the term "delta-sigma modulator" is sometimes also referred to as "sigma-delta modulator", with the transposition of the terms sigma and delta being a matter of a particular author's preference. A/D converters using delta-sigma modulators typically have a modulator section that oversamples an input analog signal and consequently digitizes that signal, and a digital filtering section that removes modulation noise from the digital data stream output from the modulator section.

The output of the delta-sigma modulator 20-1 is coupled to an input of a decimator 30-1. A digital stream 40-1 is output from the delta-sigma modulator 20-1 at a rate $f_s$ and received by the decimator 30-1. The decimator 30-1 outputs an n-bit digital stream 45-1 at a rate, $f_n$, corresponding to the Nyquist rate of the analog input signal 10-1; that is, $f_n$ corresponds to approximately twice the highest frequency component of the analog input signal 10-1. Typically, $f_s$ is much greater than $f_n$, and thereby the delta-sigma modulator 20-1 performs oversampling on the analog input signal 10-1. An oversampling ratio is defined as $f_s/f_n$. The oversampling of the analog input signal 10-1 by the delta-sigma modulator 20-1 is a necessary feature of the oversampled A/D.

FIG. 2 shows another conventional, first-order, oversampling delta-sigma modulator A/D. In FIG. 2, an analog input signal 10-2 is first applied to an anti-aliasing filter 20-2, which may correspond to a simple first-order analog filter, such as a Resistor/Capacitor (RC) filter. The anti-aliasing filter 20-2 removes any aliasing frequencies from the analog input signal 10-2 due to sampling of the analog input signal 10-2 and the like, and outputs a filtered signal 30-2. The filtered signal 30-2 is then applied to a first input port of the delta-sigma modulator 40-2, which corresponds to an addition input port of an adder/subtracter 50-2. The adder 50-2 subtracts a feedback signal 60-2 from the filtered signal 30-2, and the result of this arithmetic operation, in which the feedback signal 60-2 is subtracted from the filtered signal 30-2, is an error signal 70-2.

The error signal 70-2 is applied to an analog, first-order, low pass filter 80-2. The low pass filter 80-2 removes high frequency components from the error signal 70-2 and outputs a filtered error signal 90-2. The low pass filter 80-2 primarily acts as an integrating device. Since the low pass filter 80-2 is a first-order filter, the delta-sigma modulator 40-2 as shown in FIG. 2 is a first-order delta-sigma modulator.

The transfer function of a first-order, low pass filter can be expressed as: $H(s)=1/s$, and the transfer function of a second-order low pass filter can be expressed as:

$$H(s)=[g(s+c)/(s+a)(s+b)].$$

Inaccuracies in the conversion process of the input analog function into a digital signal (such inaccuracy is also known as modulator noise) are reduced by the delta-sigma modulator 40-2 as a result of the delta-sigma modulator keeping track of all previous conversion errors and feeding this information back, for example, as the feedback signal 60-2, in order to apply the proper amount of correction for the next conversion cycle.

In this process, the first-order delta-sigma modulator 40-2 attempts to zero out the average error over a period of time. A second-order delta-sigma modulator (i.e., a delta-sigma modulator in which low pass filter 80-2 is a second order filter) not only keeps the average error at a zero value, but also keeps the first derivative of the error signal 70-2 at a zero value.

In a first-order system, only a DC input signal can be accurately converted to digital form. However, in a second order system, both DC and AC signals can be accurately converted to digital form, but at the expense of an increased bandwidth of the digital signal.

Referring again to FIG. 2, the filtered error signal 90-2 is then applied to an r-bit quantizer 100-2, which samples the filtered error signal 90-2 at a rate $f_s$. The output signal 110-2 of the quantizer 100-2 corresponds to the output signal of the delta-sigma modulator 40-2. This output signal 110-2 is supplied to an input of a low-pass decimation filter 120-2. The output signal 110-2 of the quantizer 100-2 is also fed back through a digital-to-analog converter (D/A) 130-2 to be converted to an analog feedback signal 60-2. The analog feedback signal 60-2 is input to a subtraction input port of the adder/subtracter 50-2, in order to create the updated error signal 70-2.

The feedback loop contained within the delta-sigma modulator 40-2 is necessary to cause the error signal 70-2 to be as close to zero as possible, so that the output signal 110-2 of the delta-sigma modulator 40-2 is maintained as close to the digital equivalent of the analog input signal 10-2 as possible.

The low-pass decimation filter 120-2 receives the output signal 110-2 at a rate f, and outputs an n-bit digital signal 140-2. The n-bit digital signal 140-2 is then down-sampled by a down-sampler 150-2 at a rate $f_n$ corresponding to the Nyquist rate of the analog input signal 10-2. An n-bit output digital signal 160-2 corresponding to the "digitized" version of the analog input signal 10-2 is recovered at the output of the down-sampler 150-2.

FIG. 3 shows still another conventional, over-sampled delta-sigma modulator A/D. Delta-sigma modulator 40-3 corresponds to a series combination of an adder/subtracter 50-3, a first-order, low pass analog filter 80-3, a quantizer 100-3 outputting a digital data stream 110-3, a digital integrator 55-3 and a digital-to-analog converter 130-3. The output 60-3 of the digital-to-analog converter 130-3 is fed to a subtraction input of the adder/subtracter 50-3. A decimation filter 120-3 is connected to the output of delta-sigma modulator 40-3, and a down-sampler 150-3 is connected to the output of the decimation filter 120-3.

By utilizing an A/D having a delta-sigma modulator, one can achieve processing at very high precision by the use of the oversampling process of the delta-sigma modulator. By oversampling the input analog signals, the quantization noise and other high frequency noise associated with the analog-to-digital conversion are suppressed because of the use of a high sampling rate with respect to the Nyquist rate of the input signal. Such applications of A/Ds have utility in the telecommunications field, the voice synthesis field, and other fields that require high resolution digital processing of analog signals.

However, in all of these above-described A/Ds using delta-sigma modulators, only one analog signal at a time can be digitized by the delta-sigma modulator. Since the delta-sigma modulator contains relatively large and expensive analog hardware, this limitation of conventional approaches results in the need to have one delta-sigma modulator for every analog signal that needs to be simultaneously digitized, thereby increasing the size and cost of integrated circuits having such components.

U.S. Pat. No. 5,345,236, invented by J. Sramek, discloses a delta-sigma modulator A/D having an input multiplexer and an output demultiplexer. However, in the A/D as disclosed by Smarek, the output of the delta-sigma modulator provides a one-bit digital data stream that is then output to a digital filter. The digital filter feeds a demultiplexer, which in turn feeds a bank of data channel registers, where the data is accumulated and averaged to remove AC line noise on a per channel basis.

SUMMARY OF THE INVENTION

It is an object of the invention to provide a multiplexed, delta-sigma modulator A/D which does not require a bank of data channel registers to accumulate and average each of the digital signals output from the demultiplexer to obtain the desired digital signals.

Accordingly, it is also an object of the invention to provide a first down-sampler and a second down-sampler to a multiplexed, delta-sigma modulator A/D, wherein a plurality of signals can utilize the delta-sigma modulator in a time-division multiplexed manner without the need to accumulate the signals output from the delta-sigma modulator to obtain an average for each of the signals.

These objects, and other objects, are accomplished by a system according to the invention, which includes an input multiplexer for receiving a plurality of input analog signals, a delta-sigma modulator for performing delta-sigma modulation of the plurality of input analog signals in a time-division multiplexed manner, and a decimator for decimating an output of the delta-sigma modulator. A first down-sampler samples an output of the decimator at a first predetermined rate. An output demultiplexer receives an output of the first down-sampler and outputs a plurality of demultiplexed signals corresponding on a one-to-one basis to the plurality of input analog signals. A plurality of second down-samplers respectively connected to the output ports of the demultiplexer samples the demultiplexed signals at a second predetermined rate and outputs a plurality of digital signals.

BRIEF DESCRIPTION OF THE DRAWINGS

The invention is set forth with particularity in the appended claims. The invention, together with further objects and advantages thereof, may best be understood by making reference to the following description taken in conjunction with the accompanying drawings wherein:

DETAILED DESCRIPTION OF THE EMBODIMENTS

Figure 4:
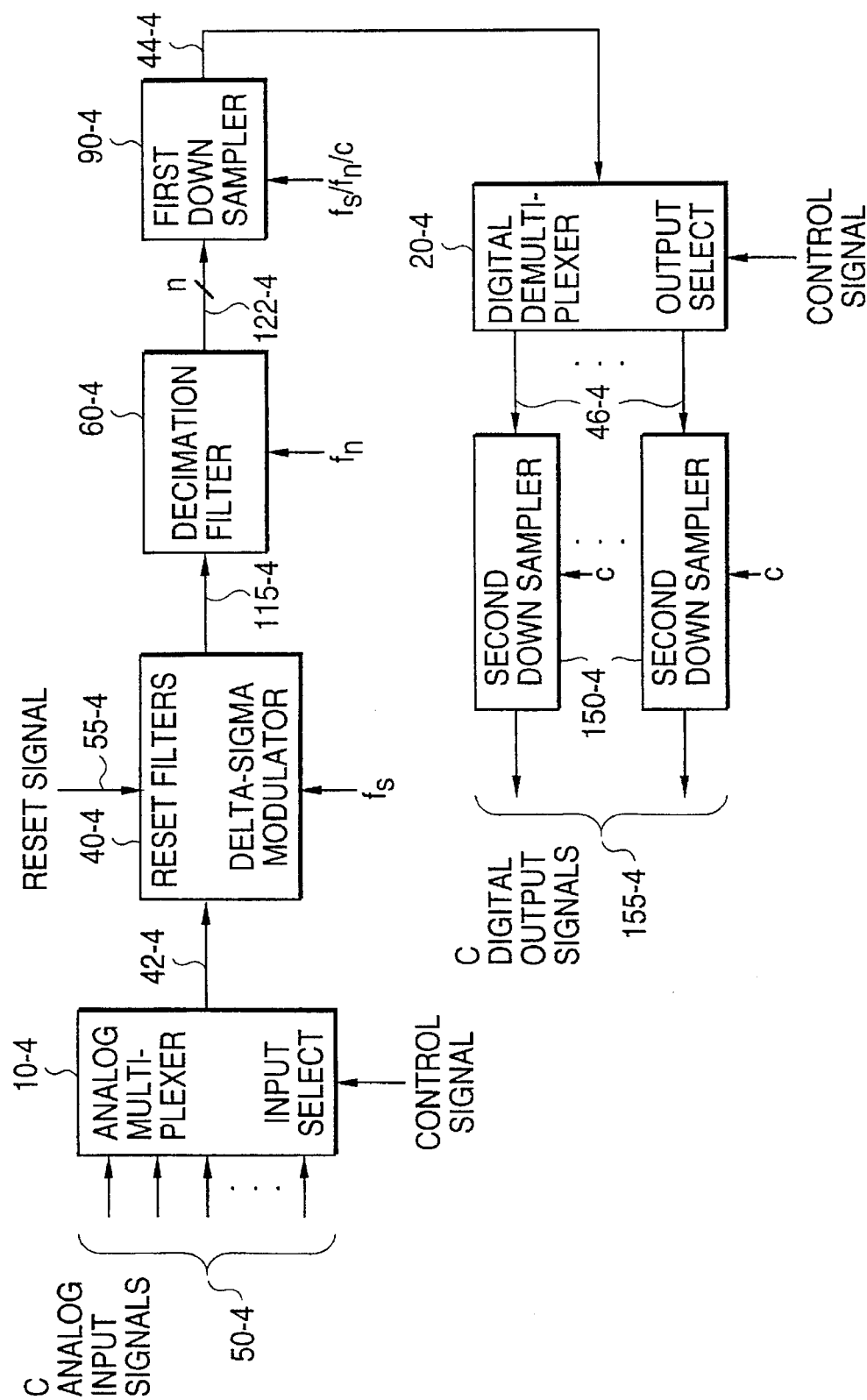
FIG. 4 is a block diagram of an analog-to-digital converter according to the invention.

According to the invention, and as shown in FIG. 4, a first down-sampler 90-4 and a plurality of second down-samplers 150-4 are respectively located at an input port and a plurality of output ports of a demultiplexer 20-4. As is well known in the digital processing art, the combination of the delta-sigma modulator 40-4 and the decimation filter 60-4 is commonly used as an over-sampled, analog-to-digital converter.

As is also known in the art, the addition of the analog multiplexer 10-4 and the digital demultiplexer 20-4 to the respective input and output ports of the oversampled analog-to-digital converter enables the delta-sigma modulator 40-4 to process a plurality of analog input signals 50-4 in a time-shared manner. That is, the delta-sigma modulator 40-4 is capable of converting a time-division multiplexed analog signal 42-4 received from the multiplexer 10-4 into a time-division multiplexed digital signal 44-4 that is output to the demultiplexer 20-4.

The time-division multiplexed digital signal 44-4 is then demultiplexed by the demultiplexer 20-4 into a plurality of demultiplexed signals 46-4, where each of the demultiplexed signals 46-4 respectively corresponds to one of the plurality of analog input signals 50-4. These plurality of demultiplexed signals 46-4 are further down-sampled at each of the output ports of the demultiplexer 20-4 by a plurality of down-samplers 150-4 at a sampling rate based on the number of analog input signals 50-4. An output 155-4 of each of these down-samplers 150-4 corresponds to the digitized version of a respective one of the plurality of analog input signals 50-4.

The performance of the multiplexed delta-sigma modulator analog-to-digital converter is determined by the number of input channels, as well as by the oversampling ratio, the decimation filter structure, and the order of the feedback loop of the delta-sigma modulator. Each of these parameters is a major design parameter for a non-multiplexed, delta-sigma modulator analog-to-digital converter.

According to the invention as shown in FIG. 4, there are c analog input signals 50-4 at the c input ports of the input multiplexer 10-4. The input multiplexer 10-4 operates at a switching rate $f_{mux}$. That is, the switching between one of the c analog input signals 50-4 being connected (via one of the c input ports of the multiplexer 10-4) to the output port of the input multiplexer 10-4, to the next sequential one of the analog input signals 50-4 being connected to the output port of the input multiplexer 10-4 is done at a rate $f_{mux}$. This switching rate is under control of the control signal input to the input select port of the multiplexer 10-4.

Figure 1:
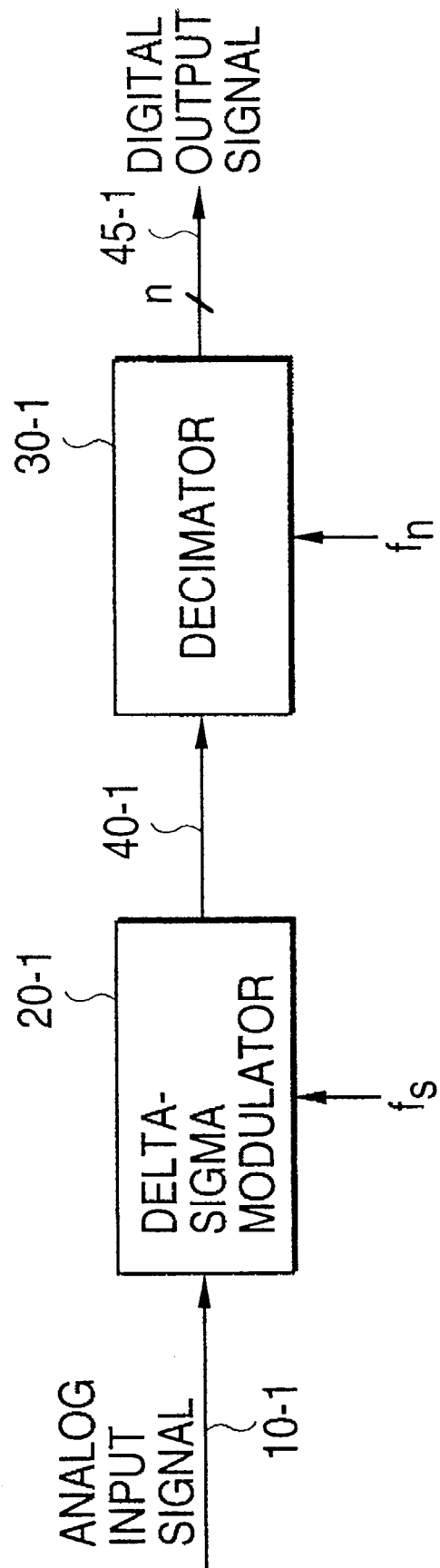
FIG. 1 is a block diagram of a conventional, oversampled analog-to-digital converter using a delta-sigma modulator and a decimator.
Figure 2:
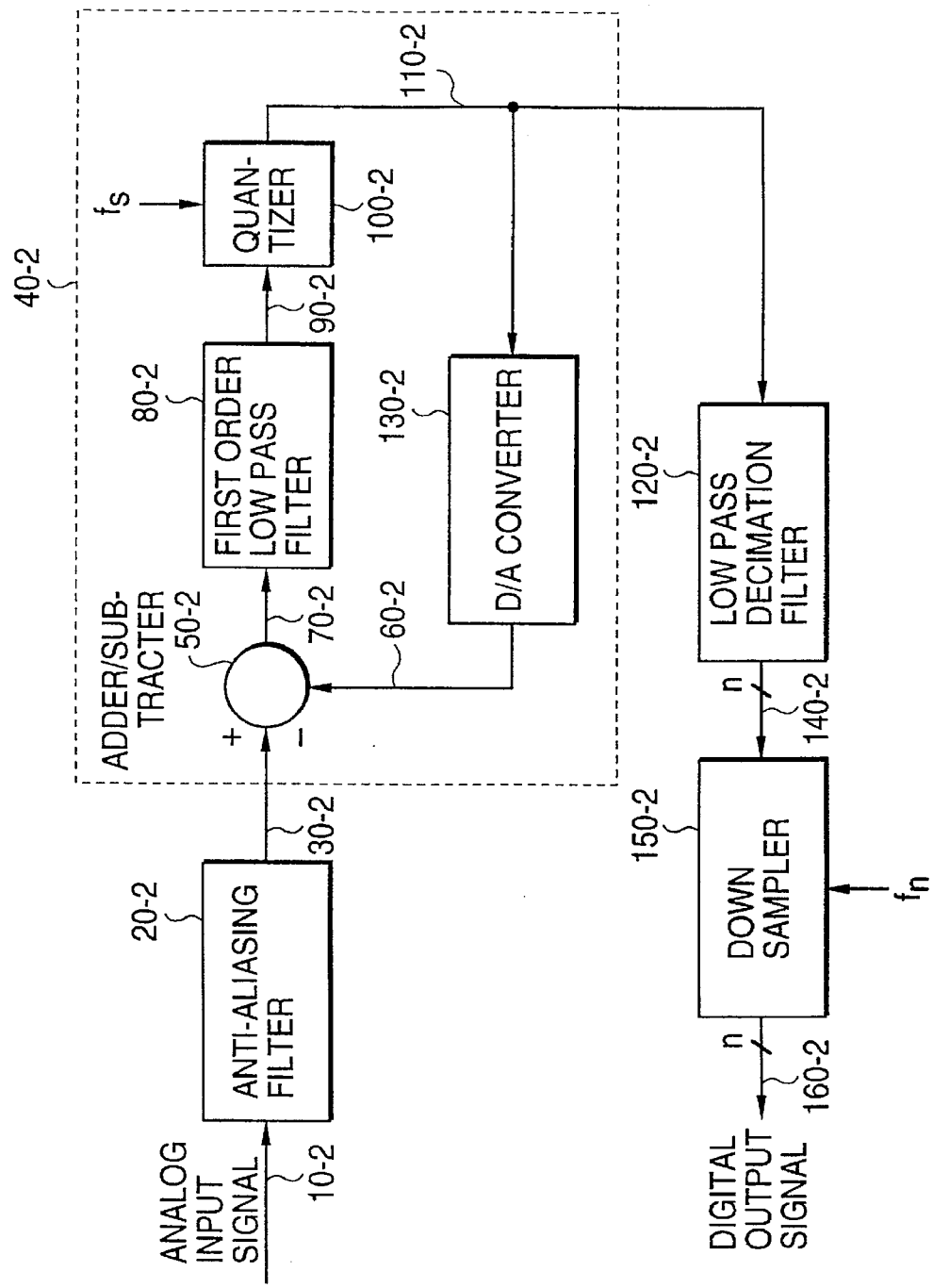
FIG. 2 is a block diagram of a second type of conventional, oversampled analog-to-digital converter using a delta-sigma modulator and a decimator.
Figure 3:
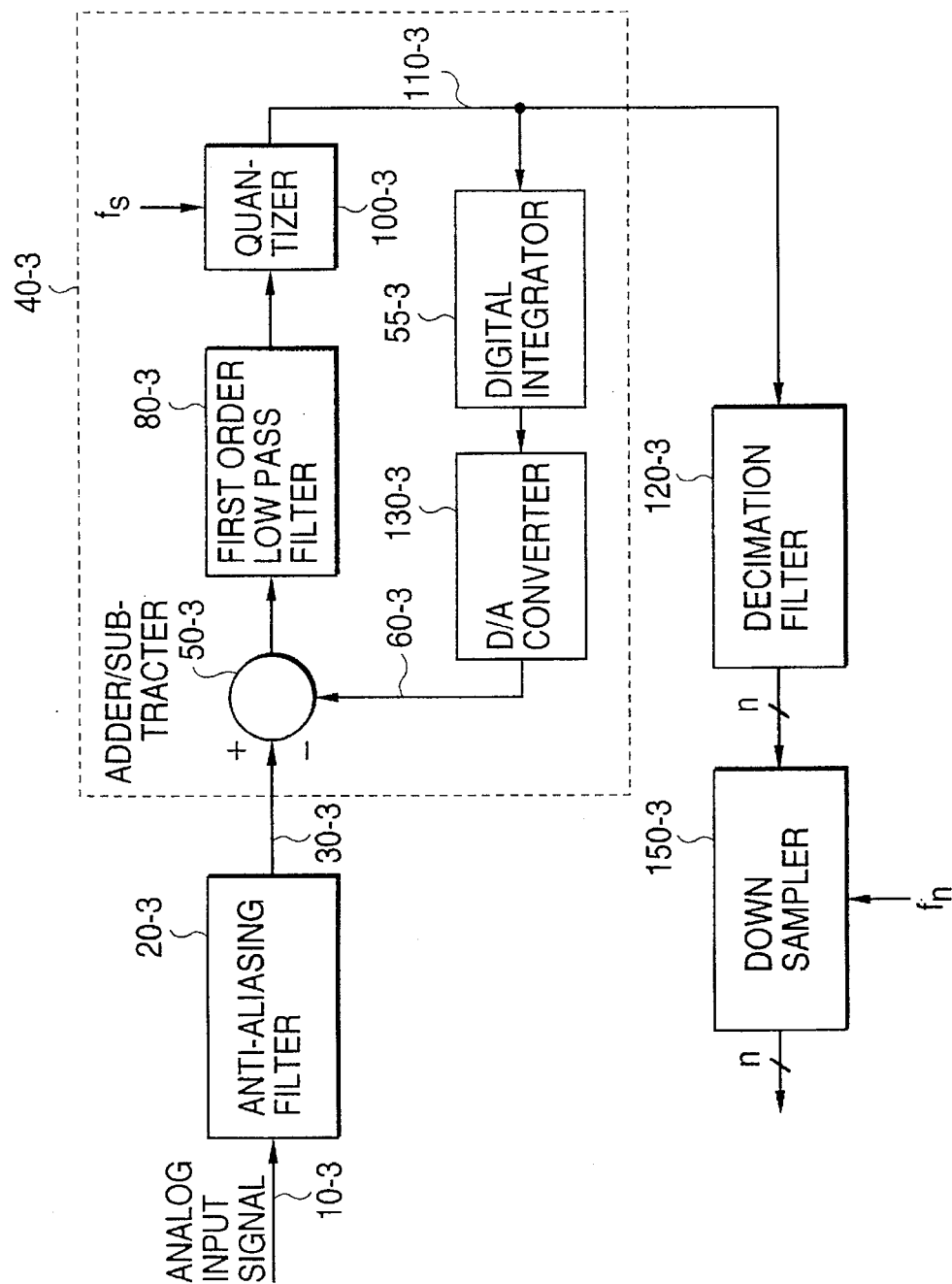
FIG. 3 is a block diagram of a third type of conventional, oversampled analog-to-digital converter using a delta-sigma modulator and a decimator.
Figure 7:
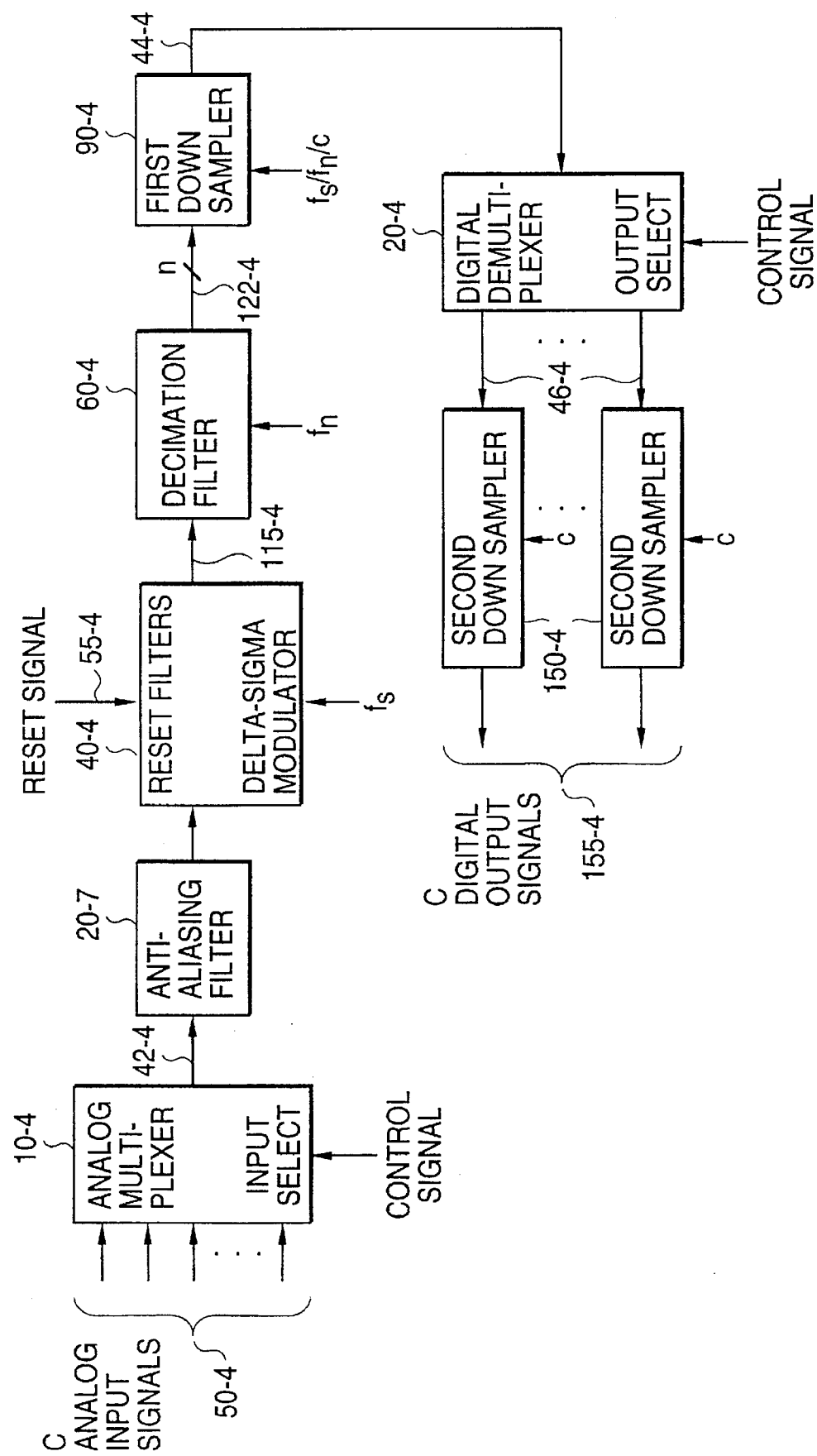
FIG. 7 is a block diagram of an analog-to-digital converter according to the invention with an anti-aliasing filter incorporated therein.

In the configuration as shown in FIG. 4, note that an antialiasing filter (See 20-2 of FIG. 2) is not included. In the invention, an anti-aliasing filter is an optional component of the oversampled delta-sigma modulator A/D according to the invention. Such a component may be added between the input multiplexer 10-4 and the delta-sigma modulator 40-4 to eliminate noise, such as that associated with switching between each of the c analog input signals 50-4. Such a configuration with an anti-aliasing filter 20-7 according to the invention is shown in FIG. 7.

Referring back to FIG. 4, the input multiplexer 10-4 switches between the c analog input signals 50-4 at a rate $f_{mux}$, and the input multiplexer 10-4 outputs a time-division multiplexed analog signal 42-4 on its output port. The input multiplexer 10-4 selects a first analog input signal at a time $[t_o]$, a second analog input signal at a time $[t_o+1/f_{mux}]$, a third analog input signal at a time $[t_o+1/(2/f_{mux})]$, . . . . , a $(c-1)^{th}$ analog input signal at a time $[t_o+1/((c-2)/f_{mux})]$, a $c^{th}$ analog input signal c at a time $[t_o+1/((c-1)/f_{mux})]$, and returns back to select the first analog input signal at a time $[t_o+1/(c/f_{mux})]$. In effect, a time-division multiplexed signal having multiple data frames, with each frame having a duration corresponding to $1/f_{mux}$ seconds, is generated at the output of the input multiplexer 10-4. At the output port of the input multiplexer 10-4, the c analog input signals 50-4 are respectively placed into c sequential frames, so that each of the c analog input signals 50-4 is operated on by the delta-sigma modulator 40-4 at least once every $1/(c/f_{mux})$ seconds.

One way of obtaining such a sequence of the c analog input signals 50-4 is to connect a sequential counter to an input select terminal of the input multiplexer 10-4, whereby the sequential counter counts up to "c", and then resets itself back to zero. This setup ensures that the input multiplexer 10-4 sequentially selects each of the c analog input signals 50-4 in a periodic, continuous fashion. Of course, other types of counters or state machines can be employed to select among the c analog input signals 50-4 in a sequential or non-sequential manner for performing a particular function while still remaining within the scope of the invention.

The time-division multiplexed analog signal 42-4 including the c analog input signals 50-4 in their respective frames is input to the delta-sigma modulator 40-4, which operates at a sampling rate of $f_s$. The sampling rate f, is a rate higher than the Nyquist rate for any of the c analog input signals 50-4. Sampling the analog input at a rate higher than the Nyquist rate ensures that the c analog input signals 50-4 are oversampled by the delta-sigma modulator 40-4.

FIG. 4 also shows a reset control signal 55-4, which is an input to the delta-sigma modulator 40-4 and is used to reset the internal filters of the delta-sigma modulator 40-4 (see the low pass analog filter 80-2 of FIG. 2) based upon the rate of the time division multiplexing of the c analog input signals 50-4. The reset control signal 55-4 is needed to reset the internal filters of the delta-sigma modulator 40-4 to accommodate the next one of the c analog input signals 50-4, as each of these signals is sequentially switched into the delta-sigma modulator 40-4 by the input multiplexer 10-4.

According to the invention, the output of the delta-sigma modulator 40-4 is a digital data stream 115-4 which corresponds to a digitized amplitude level of one of the c analog input signals 50-4. The output of the delta-sigma modulator 40-4 is input to a decimation filter 60-4, which can be an averaging filter. For example, the transfer function of the decimation filter is expressed as:

$$H(z) = \sum_{1}^{k} z^{-i}$$

Other transfer functions are possible for the decimation filter 60-4 to be utilized in the invention as described herein, and one of ordinary skill in the art can envision other transfer functions for the decimation filter 60-4 to operate properly in the multiplexed delta-sigma modulator A/D system according to the invention.

The decimation filter 60-4 receives the input digital data stream 115-4 at a rate $f_s$ which corresponds to the sampling rate of the delta-sigma modulator 40-4. The decimation filter 60-4 outputs a corresponding n-bit digital data stream 122-4 at a slower rate, $f_n$. In the decimation filter 60-4, a sequential block of the input digital data stream 115-4 is stored, and the n-bit digital data stream 122-4 is derived from the stored sequential block of the input digital data stream 115-4. The decimation filter 60-4 primarily acts to eliminate quantization noise and other high frequency noise components generated in the delta-sigma modulator 40-4.

The n-bit digital data stream 122-4 output from the decimation filter 60-4 at a rate $f_n$ is applied to a first down-sampler 90-4, which samples the n-bit digital data stream 122-4 at a rate $f_s/f_n/c$, where $f_s$ is the oversampling rate of the delta-sigma modulator 40-4, and where c is the number of analog input signals 50-4 at the input ports of the input multiplexer 10-4. The determination of the first down-sampling rate, as given by the relationship above, is an important feature of the invention, as well as the location of the first down-sampler 90-4 between the decimation filter 60-4 and the output demultiplexer 20-4.

The output of the down-sampler 90-4 is a time-division multiplexed, sampled digital signal 44-4 corresponding to the time-division multiplexed analog signal 42-4 input to the delta-sigma modulator 40-4. The time-division multiplexed, sampled digital signal 44-4 is then sent to an input port of an output demultiplexer 20-4. A demultiplexed digital signal 46-4 is respectively sent to one of the output ports of the output demultiplexer 20-4 based on the control signal input to the output select port of the demultiplexer 20-4.

The output demultiplexer 20-4 switches between its c output ports at a switching rate $f_{mux}$, which corresponds exactly to the c input ports-to-output port switching rate of the input multiplexer 10-4. In a similar fashion to the process of the input multiplexer 10-4 sequentially switching between the c analog input signals 50-4, the output demultiplexer 20-4 outputs a demultiplexed signal 46-4 in a sequential manner to the "c" output ports of the output demultiplexer 20-4. The portion of the demultiplexed signal 46-4 received by the $i^{th}$ port of the output demultiplexer 20-4 directly corresponds to a frame of the input time-division multiplexed digital signal 42-4 from the $i^{th}$ input port of the input multiplexer 10-4, which was digitized by the delta-sigma modulator 40-4, decimated by the decimator 60-4, and sampled by the first down-sampler 90-4.

In this manner, a demultiplexed signal 46-4 corresponding to the first of the c analog input signals 50-4 appears at the first output port of the output multiplexer 20-4, the second of the c analog input signals 50-4 appears at the second output port of the output multiplexer 20-4, etc. Since these c demultiplexed signals are oversampled at a rate c, it is required that there be a second down-sampler 150-4 at each of the c output ports of the output demultiplexer 20-6, in order to get back to the Nyquist rate.

With an input multiplexer 10-4 and an output demultiplexer 20-4 in the A/D structure, more than one analog input signal can be received by a single delta-sigma modulator 40-4 in a time-division multiplexed manner and digitized by the single delta-sigma modulator into a digital time-division multiplexed signal. This multiplexed signal can then be decimated to a slower rate, and then down-sampled at a predetermined rate. The down-sampled signal is then applied to a demultiplexer 20-4 to output a plurality of demultiplexed signals. The demultiplexed signals are down-sampled again to arrive at the correct sampling rate to recover each of a plurality of digital signals which respectively correspond to one of the analog input signals.

A feature of the invention is that at each of the c output ports of the output demultiplexer 20-4 is a second down-sampler 150-4, which samples the demultiplexed signal 46-4 received from a respective one of the output ports at a rate corresponding to c Hz. The digital signal 155-4 output from the second down-sampler 150-4 corresponds to a digitized version of a respective one of the c analog input signals 50-4. The second down-sampler 150-4 is used according to the invention to correctly retrieve each digital signal 155-4 from the respective outputs of the demultiplexer 20-4, which contain over-sampled data.

In a similar manner as that described herein for selecting one of the c possible analog input signals 50-4 from the c input ports of the input multiplexer 10-4, one possible way of selecting one of the c output ports of the output demultiplexer 20-6 is to connect a counter to an output port select terminal of the output demultiplexer 20-4. The counter sequentially counts up to "c", and then resets itself back to zero. This setup ensures that the output demultiplexer 20-4 will sequentially step through the c output ports of the output demultiplexer 20-4 in a periodic fashion, thereby assuring that a frame of the time-division multiplexed digital signal 44-4 corresponding to one of the c analog input signals 50-4 that has been digitized by the delta-sigma modulator 40-4 is sent to the proper output port of the output demultiplexer 20-4.

This invention is particularly useful for converting slow-varying analog signals into digital signals. Applications include pointing devices (as mouse on a computer, for example), battery chargers and instrumentation. Since each of these analog signals is slow-varying, they can be combined as a time-division multiplexed analog signal, processed by the single delta-sigma modulator 40-4, and then demultiplexed into a plurality of digital signals without any loss in information content.

The system according to the invention is useful in situations where more than one signal needs to be converted from analog to digital form, or in cases where a plurality of analog signals need to be transmitted through a single digital channel, in which case the output multiplexer would not be necessary.

The advantages of the invention over conventional, multiplexed oversampled A/D converters is that there is no requirement to have accumulators at the output of the delta-sigma modulator in order to determine the averages for the output digital signals.

Figure 5:
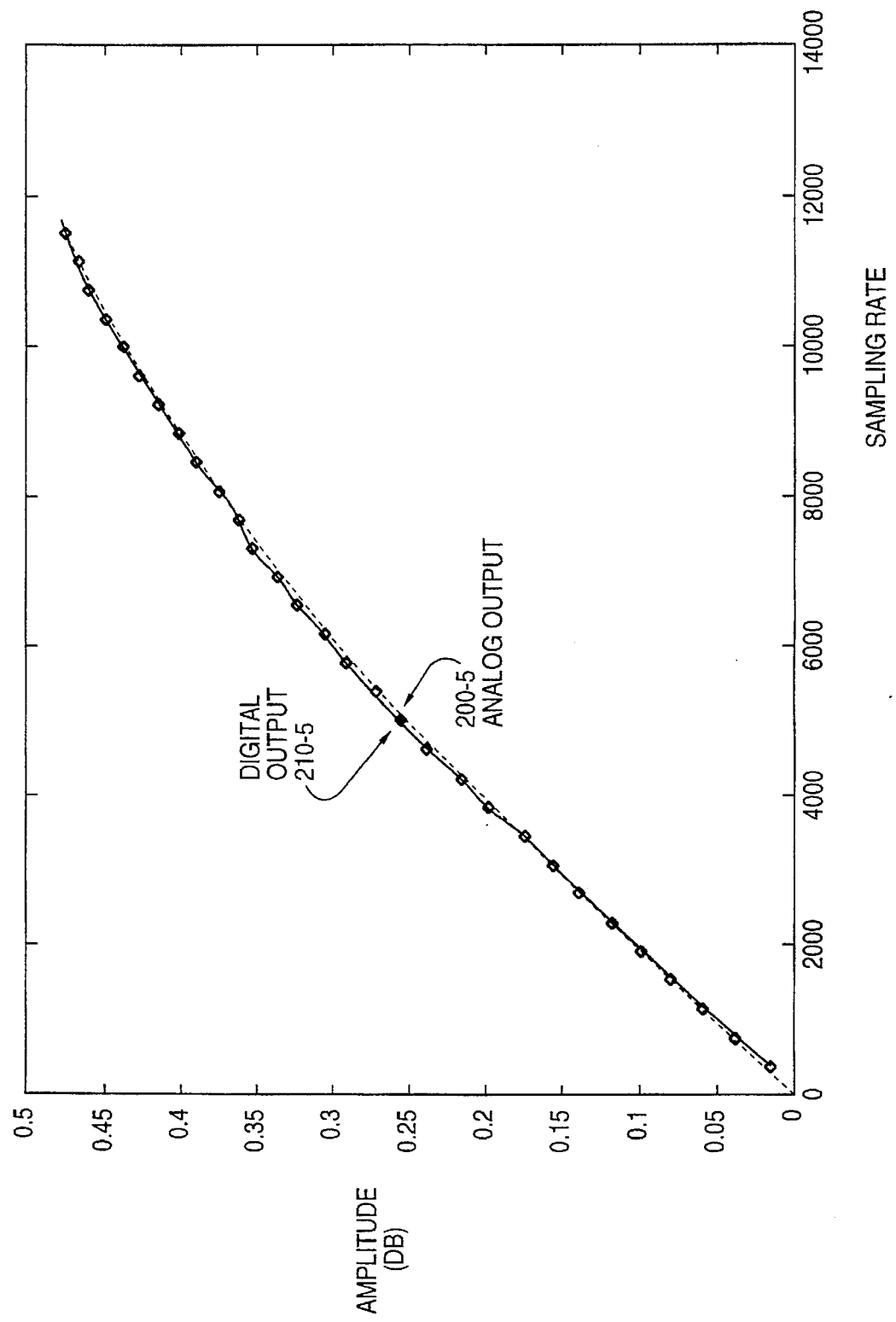
FIG. 5 is a comparison of an analog input level versus a digital output level for an analog-to-digital converter according to the invention.

Computer simulations have revealed that the digital signals output from the delta-sigma modulator according to the invention closely approximate their respective analog signal counterparts, as can be seen from the closeness of the analog input signal 200-5 and the delta-sigma modulator digital output 210-5 corresponding to the analog input signal 200-5, as seen in FIG. 5.

Figure 6:
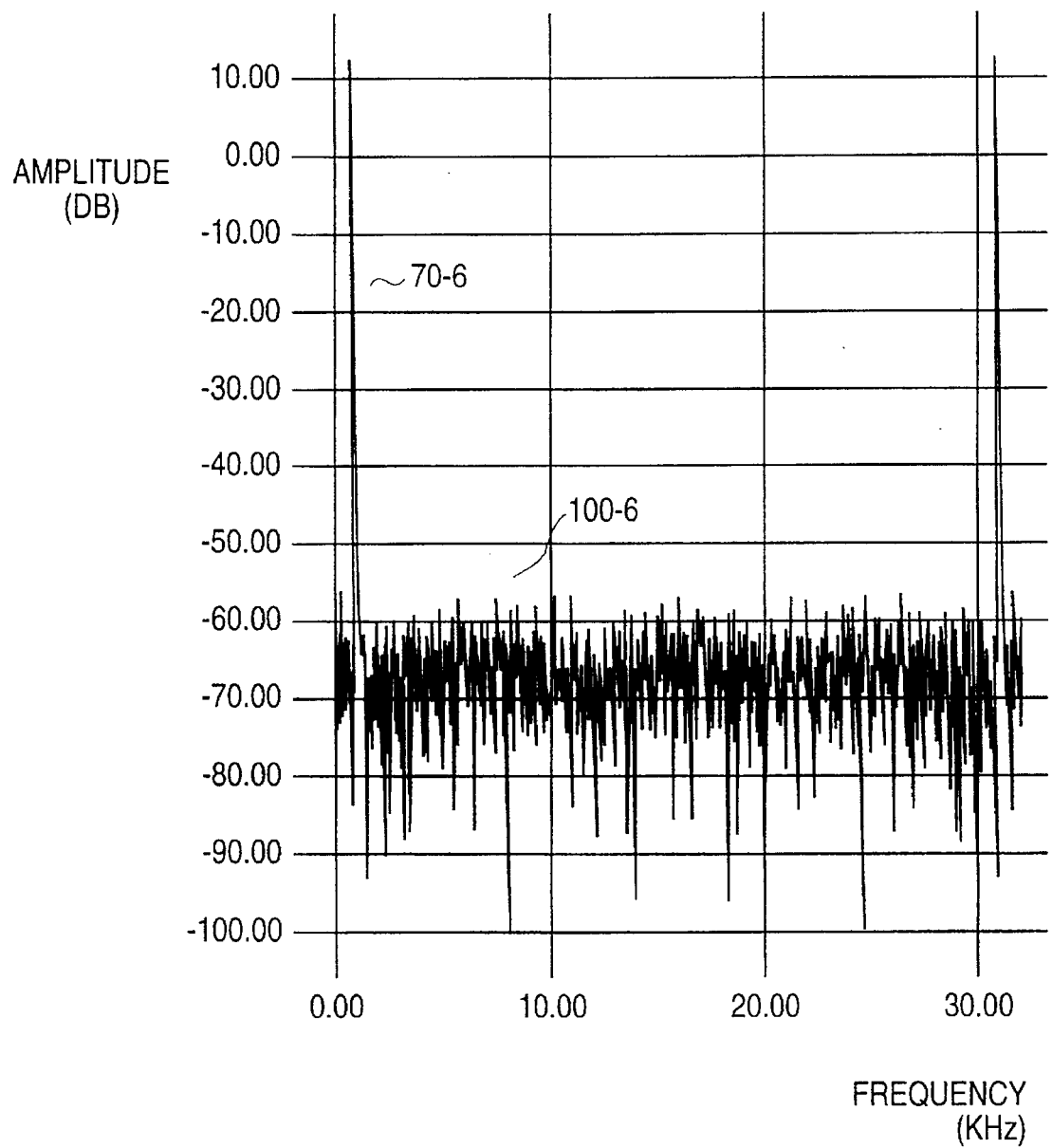
FIG. 6 shows the power spectrum of a 1 kHz signal input to an analog-to-digital converter according to an embodiment of the invention.

FIG. 6 shows a power spectrum of the delta-sigma modulator output for a 1 kHz analog input signal, which corresponds to the Fourier transform of the multiplexed delta-sigma modulator output. The output signal 70-6 corresponding to the 1 kHz analog input signal is clearly seen as a spike at a frequency corresponding to around 1 kHz. Note that the quantization noise floor 100-6 is at most −60 dB, while the output signal 70-6 is approximately 70 dB greater than the quantization noise floor 100-6.

FIG. 7 shows a configuration according to the invention, in which an anti-aliasing filter 20-7 has been added between the input multiplexer 10-4 and the delta-sigma modulator 40-4. Note that this figure closely matches the configuration as shown in FIG. 4, with all of the elements in FIG. 4 also appearing in FIG. 7. The anti-aliasing filter 20-7 is used to remove aliasing noise and AC line spectra from the analog input to the delta-sigma modulator 40-4.

While embodiments of the invention have been described, modifications of the described embodiments may become apparent to those of ordinary skill in the art, following the teachings of the invention, without departing from the scope of the invention as set forth in the appended claims.

What is claimed is:

1. A system comprising:

an multiplexer having a plurality of input ports and a single output port, said multiplexer receiving an analog signal on each respective one of said plurality of input ports, said multiplexer selecting said analog signal on each of said plurality of input ports at a first predetermined rate, and outputting a time-division-multiplexed analog signal, a delta-sigma modulator connected to receive said time-division multiplexed analog signal on an input port thereof, said delta-sigma modulator sampling said time-division multiplexed analog signal at a second predetermined rate, and outputting a time-division multiplexed modulated signal on an output port, a decimator connected to receive said time-division multiplexed modulated signal, and outputting an n-bit time-division multiplexed digital signal at a third predetermined rate, a first down-sampler connected to sample said n-bit time-division multiplexed digital signal, and outputting a first down-sampled signal at a fourth predetermined rate, a demultiplexer connected to receive said first down-sampled signal on an input port and having a plurality of output ports for outputting a digital signal on each respective one of said plurality of output ports in a one-to-one correspondence with said analog signal on each respective one of said plurality of input ports of said multiplexer, wherein each of said plurality of output ports is operatively connected to said single input port at said first predetermined rate, and a plurality of second down-samplers, each of said plurality of down-samplers being respectively connected to one of said plurality of output ports of said demultiplexer, said plurality of second down-samplers sampling said digital signal on said respective output port of said demultiplexer at a fifth predetermined rate.

2. The system according to claim 1, further comprising a first control signal connected to an input select control of said multiplexer and a second control signal connected to an input select control of said output demultiplexer, said first and second control signal respectively supply a switch rate corresponding to said first predetermined rate to said multiplexer and to said demultiplexer.

3. The system according to claim 2, wherein said switch rate corresponding to said first control and second control signal are respectively supplied to said multiplexer and said demultiplexer at a same time.

4. The system according to claim 2, further comprising a binary counter connected to said multiplexer and said demultiplexer, wherein said first and second control signal are respectively output from said binary counter to said multiplexer and said demultiplexer.

5. A system according to claim 1, wherein said delta-sigma modulator includes an adder/subtracter, an analog low pass filter connected to said adder/subtracter, an n-level quantizer connected to said analog low pass filter, a digital integrator connected to said n-level quantizer, and a digitalto-analog converter connected to said digital integrator and said adder/subtracter, and wherein an output of the digital-to-analog converter is subtracted from said time-division multiplexed signal by said adder/subtracter to create an error signal.

6. A system according to claim 5, wherein said analog low pass filter is a first order filter.

7. A system according to claim 5, wherein said analog low pass filter is an $r^{th}$ order filter, wherein r is an integer greater than or equal to two.

8. A system according to claim 5, further comprising a reset signal connected to said digital integrator, wherein said reset signal can have one of a first state or a second state at any instant in time, and said digital integrator clears itself upon receipt of a change in a state of said reset signal.

9. A system as recited in claim 1, wherein said multiplexer sequentially selects one of said plurality of input ports of said multiplexer.

10. A system as recited in claim 1, wherein said multiplexer non-sequentially selects one of said plurality of input ports of said multiplexer.

11. A system as recited in claim 1, wherein said fourth predetermined rate is determined by said second predetermined rate divided by said third predetermined rate divided by n, wherein n is an integer corresponding to a number of the plurality of input ports of said multiplexer.

12. A system as recited in claim 1, wherein said fifth predetermined rate is n, wherein n is an integer corresponding to a number of the plurality of output ports of said demultiplexer.

13. The system according to claim 1, wherein said first predetermined rate is greater than a Nyquist rate corresponding to said analog signal.

14. A system according to claim 1, wherein said second predetermined rate is greater than said third predetermined rate.

15. A system according to claim 1, further comprising an anti-aliasing filter connected between said multiplexer and said delta-sigma modulator, wherein said anti-aliasing filter removes noise components from said time-division multiplexed analog signal.

16. A system according to claim 1, wherein said decimation filter is an averaging filter.

17. A system according to claim 1, wherein an output characteristic of said decimation filter is determined as:

$$H(z)=\Sigma^k_i Z^{-1}$$

18. In combination with a multiplexed delta-sigma modulator of the type wherein c analog input signals are received at a plurality of input ports of an input multiplexer, where c is an integer value greater than one, a delta-sigma modulator having an input port connected to an output port of said input multiplexer and operating at a first oversampled rate, a digital filter having an input port connected to said output port of said delta-sigma modulator and operating at a second oversampled rate, an output demultiplexer having an input port connected to said output port of said digital filter and having a plurality of output ports that each output a demultiplexed signal corresponding to one of said c analog input signals, and a plurality of data channel registers respectively connected to said plurality of output ports of said demultiplexer for averaging data at each of said plurality of output ports of said demultiplexer, the improvement which comprises:

a first down-sampler coupled between said output port of said digital filter and said input port of said output demultiplexer, said first down-sampler operating at a first sampling rate corresponding to said first oversampled rate divided by said second oversampled rate divided by c Hz; and a plurality of down-samplers respectively coupled between said plurality of output ports of said output demultiplexer and said plurality of data channel registers, said second down-samplers operating at a second sampling rate corresponding to c Hz.

19. The improvement according to claim 18, further comprising:

a control signal connected to an input select control of said input multiplexer and an output select control of said output demultiplexer, said control signal supplying a predetermined switching rate between said plurality of input ports of said multiplexer and said plurality of output ports of said demultiplexer.

20. The improvement according to claim 18, further comprising a binary counter, wherein said control signal is output from said binary counter to said multiplexer and demultiplexer.

21. The improvement according to claim 18, wherein said first oversampled rate is greater than a Nyquist rate corresponding to each of said c analog input signals.

* * * * *